(12) United States Patent
Kannan et al.

(10) Patent No.: US 9,401,312 B1
(45) Date of Patent: Jul. 26, 2016

(54) TSV REDUNDANCY SCHEME AND ARCHITECTURE USING DECODER/ENCODER

(71) Applicant: GLOBALFOUNDRIES Inc., Grand Cayman, KY (US)

(72) Inventors: Sukeshwar Kannan, Malta, NY (US); Kaushal Kannan, Auburn, AL (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/736,769

(22) Filed: Jun. 11, 2015

(51) Int. Cl.
*H01L 21/768* (2006.01)
*H03K 19/177* (2006.01)
*H03K 19/173* (2006.01)
*H01L 21/66* (2006.01)

(52) U.S. Cl.
CPC .......... *H01L 22/12* (2013.01); *H01L 21/76898* (2013.01); *H03K 19/1735* (2013.01); *H03K 19/17736* (2013.01); *H03K 19/17764* (2013.01)

(58) Field of Classification Search
CPC ............. H01L 22/13; H01L 21/76898; H03K 19/17736; H03K 19/17764; H03K 19/1735
USPC ................ 326/10, 38, 365; 324/568; 257/774
See application file for complete search history.

(56) References Cited

U.S. PATENT DOCUMENTS

| | | | |
|---|---|---|---|
| 8,988,130 B2 | 3/2015 | Kim et al. | |
| 2009/0091333 A1* | 4/2009 | Chung | H01L 22/22 324/538 |
| 2010/0060310 A1* | 3/2010 | Laisne | H01L 25/0657 326/10 |
| 2010/0295600 A1* | 11/2010 | Kim | H01L 25/0657 327/365 |
| 2011/0309519 A1* | 12/2011 | Kim | H01L 25/0657 257/774 |

OTHER PUBLICATIONS

Kang et al., "8Gb 3D DDR3 DRAM Using Through-Silicon-Via Technology", IEEE International Solid-State Circuits Conference, 2009, pp. 129-131.
Loi et al., "A Low-overhead Fault Tolerance Scheme for TSV-based 3D Network on Chip Links", retrieved on Jul. 7, 2015, from http://aslweb.u-aizu.ac.jp/~m5141153/2013/RPR/RPR_10_09.pdf, 5 pages.
Hsieh et al., "TSV Redundancy: Architecture and Design Issues in 3-D IC", IEEE Transactions on VLSI Systems, Apr. 2012, vol. 20, No. 4, pp. 711-722.
Miyakawa, "A 3D Prototyping Chip based on a wafer-level Stacking Technology", Design Automation Conference (ASP-DAC), 2009, p. 416-420.

* cited by examiner

*Primary Examiner* — Dylan White
(74) *Attorney, Agent, or Firm* — Ditthavong & Steiner, P.C.

(57) ABSTRACT

A method of redirecting signal bits associated with or corresponding to defective TSVs of a TSV array to a row or a column of redundant TSVs in the TSV array using a 2:4 Decoder and 4:2 Encoder and the resulting device are provided. Embodiments include forming a TSV array between a bottom die and a top die of a 3D IC stack, the TSV array having a row and a column of redundant TSVs; identifying a defective TSV of the TSV array; determining whether to shift a signal bit associated with or corresponding to the defective TSV in a first and/or a second direction towards the row or the column of redundant TSVs; and shifting the signal bit in the first and/or the second direction until the signal bit has been redirected to the row or the column of redundant TSVs.

19 Claims, 6 Drawing Sheets

TSV REDUNDANCY SCHEME AND ARCHITECTURE USING DECODER/ENCODER

TECHNICAL FIELD

The present disclosure relates to the manufacture of semiconductor devices with a through silicon via (TSV) array. The present disclosure is particularly applicable to three-dimensional (3D) integration.

BACKGROUND

A TSV provides communication links between dies in a vertical direction and is a critical design issue in 3D integration. Similar to other components of a 3D integrated circuit (IC) stack, the fabrication and bonding of TSVs can fail. A failed TSV can severely increase cost and decrease yield as the number of dies to be stacked increases.

A known approach to solve this problem involves using a switching box in a 3D dynamic random-access memory (DRAM) design where for every four signal TSVs there are two redundant TSVs, i.e., 50% TSV redundancy. This approach works where the delay in all of the TSVs are identical; however, this approach takes up more space on the die and is not a cost effective solution for application-specific integrated circuit (ASIC) applications. A second known approach involves a fault tolerant scheme for a 3-D network on chip (3-DNoC) where there are four redundant TSVs for every 38 signal TSVs (32 I/O+6 control signals). This approach makes assumptions such as 100,000 TSVs form a chain, and there are 9.87 defects per million opportunities. Even though the yield improves from 68% to 98%, this assumption does not hold true for other designs and, therefore, cannot be universally adopted as a viable solution.

A third known approach involves using a redundant TSV for every signal TSV (100% redundancy). This scheme has no constraints, but is not a cost effective solution when there is a large array of TSVs like in memory-on-logic applications. A fourth approach involves a shift-right TSV redundancy architecture where there is one redundant TSV per row for an array of TSVs. This scheme has low TSV redundancy, but fails if there is more than one failing TSV in a single row.

A need therefore exists for methodology enabling a cost effective TSV redundancy architecture that has a low area overhead and can overcome issues of multiple fails in a single row or column in the TSV array and the resulting device.

SUMMARY

An aspect of the present disclosure is a method of redirecting signal bits associated with or corresponding to defective TSVs of a TSV array to a row or a column of redundant TSVs in the TSV array using a 2:4 Decoder and 4:2 Encoder.

Another aspect of the present disclosure is a device including a TSV array having a row and a column of redundant TSVs and a 2:4 Decoder and 4:2 Encoder attached to each TSV.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a TSV array between a bottom die and a top die of a 3D IC stack, the TSV array having a row and a column of redundant TSVs; identifying a defective TSV of the TSV array; determining whether to shift a signal bit associated with or corresponding to the defective TSV in a first and/or a second direction towards the row or the column of redundant TSVs; and shifting the signal bit in the first and/or the second direction until the signal bit has been redirected to the row or the column of redundant TSVs.

Aspects of the present disclosure include forming the TSV array between the bottom die and the top die by: connecting each TSV to a 2:4 Decoder in the bottom die and a 4:2 Priority Encoder in the top die. Other aspects include connecting each 2:4 Decoder corresponding a non-redundant TSV to a first adjacent TSV in the first direction and a second adjacent TSV in the second direction, the non-redundant TSV and the first and second adjacent TSVs forming an "L-shaped" pattern. Further aspects include identifying the defective TSV by: testing each TSV of the TSV array using one or more electronic fuse (eFuse) cells. Additional aspects include determining to shift the signal bit associated with or corresponding to the defective TSV in the first direction by: ascertaining whether an adjacent TSV in the first direction is defective; shifting the signal bit in the first direction when the adjacent TSV in the first direction is non-defective; determining whether the signal bit has been redirected to the row or the column of redundant TSVs; and repeating the ascertaining, shifting, and determining steps until the signal bit has been shifted to the row or the column of redundant TSVs. Another aspect includes shifting the signal bit in the first direction by: enabling a 2:4 Decoder to change a select line of the signal bit from (00) to (01). Other aspects include determining to shift the signal bit associated with or corresponding to the defective TSV in the second direction by: determining that an adjacent TSV in the first direction is defective; ascertaining whether an adjacent TSV in the second direction is defective; shifting the signal bit in the second direction when the adjacent TSV in the second direction is non-defective; determining whether the signal bit has been redirected to the row or the column of redundant TSVs; and repeating the determining, shifting, and determining steps until the signal bit has been shifted to the row or the column of redundant TSVs. Further aspects include shifting the signal bit in the second direction by: enabling a 2:4 Decoder to change a select line of the signal bit from (00) to (10). Additional aspects include enabling a 2:4 Decoder to change a select line of a signal bit associated with a non-defective TSV from (00) to (11).

Another aspect of the present disclosure is a device including: a bottom die of a 3D IC stack; a top die of the 3D IC stack; a plurality of 2:4 Decoders formed in the bottom die; a plurality of 4:2 Priority Encoders formed in the top die; and a TSV array connected by the plurality of 2:4 Decoders and the 4:2 Priority Encoders, the TSV array formed with a row and a column of redundant TSVs.

Aspects of the device include a redundant TSV being shared by the row and the column of redundant TSVs. Other aspects include each TSV of the TSV array being attached to a 2:4 Decoder in the bottom die and a 4:2 Priority Encoder in the top die. Further aspects include each non-redundant TSV being connected to a first adjacent TSV in a first direction and a second adjacent TSV in a second direction using a 2:4 Decoder, the non-redundant TSV and the first and second adjacent TSVs being connected in an "L-shaped" pattern. Additional aspects include a signal bit associated with or corresponding to a defective TSV being redirected by a 2:4

Decoder to an adjacent non-defective TSV in the first or the second direction and/or to the row or the column of redundant TSVs.

A further aspect of the present disclosure is a method including: forming a TSV array between a bottom die and a top die of a 3D IC stack, the TSV array having a row and a column of redundant TSVs; connecting each TSV to a 2:4 Decoder in the bottom die and a 4:2 Priority Encoder in the top die; testing each TSV of the TSV array using one or more eFuse cells; identifying a defective TSV of the TSV array based on the testing; determining whether to shift a signal bit associated with or corresponding to the defective TSV in a first and/or a second direction towards the row or the column of redundant TSVs; and shifting the signal bit in the first and/or the second direction until the signal bit has been redirected to the row or the column of redundant TSVs.

Aspects of the present disclosure include connecting each 2:4 Decoder corresponding a non-redundant TSV to a first adjacent TSV in the first direction and a second adjacent TSV in the second direction, the non-redundant TSV and the first and second adjacent TSVs forming an "L-shaped" pattern. Other aspects include determining to shift the signal bit associated with or corresponding to the defective TSV in the first direction by: ascertaining whether an adjacent TSV in the first direction is (a) defective; (b) was already associated with a shifted signal bit; or (c) could prevent a signal bit associated with or corresponding to another defective TSV from being shifted to the row or the column of redundant TSVs; shifting the signal bit in the first direction when the adjacent TSV in the first direction is (a) non-defective; (b) not already associated with a shifted signal bit; and (c) could not prevent a signal bit associated with or corresponding to another defective TSV from being shifted to the row or the column of redundant TSVs; determining whether the signal bit has been redirected to the row or the column of redundant TSVs; and repeating the ascertaining, shifting, and determining steps until the signal bit has been shifted to the row or the column of redundant TSVs. Further aspects include shifting the signal bit associated with or corresponding to the defective TSV in the first direction by: enabling a 2:4 Decoder to change a select line of the signal bit from (00) to (01). Additional aspects include determining to shift the signal bit associated with or corresponding to the defective TSV in the second direction by: determining that a adjacent TSV in the first direction is defective; ascertaining whether an adjacent TSV in the second direction is (a) defective; (b) was already associated with a shifted signal bit; or (c) could prevent a signal bit associated with or corresponding to another defective TSV from being shifted to the row or the column of redundant TSVs; shifting the signal bit in the second direction when the adjacent TSV in the second direction is (a) non-defective; (b) not already associated with a shifted signal bit; and (c) could not prevent a signal bit associated with or corresponding to another defective TSV from being shifted to the row or the column of redundant TSVs; determining whether the signal bit has been redirected to the row or the column of redundant TSVs; and repeating the ascertaining, shifting, and determining steps until the signal bit has been shifted to the row or the column of redundant TSVs. Another aspect includes shifting the signal bit associated with or corresponding to the defective TSV in the second direction by: enabling a 2:4 Decoder to change a select line of the signal bit from (00) to (10).

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problem of a loss of communication between dies when multiple TSVs in a row or a column fail attendant upon the fabrication and bonding of TSVs in a 3D IC stack. The problem is solved by including a row and a column of redundant TSVs and shifting signal bits associated with or corresponding to defective TSVs to the row or column of redundant TSVs.

Methodology in accordance with embodiments of the present disclosure includes forming a TSV array between a bottom die and a top die of a 3D IC stack, the TSV array having a row and a column of redundant TSVs. A defective TSV of the TSV array is identified and whether to shift a signal bit associated with or corresponding to the defective TSV in a first and/or a second direction towards the row or the column of redundant TSVs is determined. The signal bit is shifted in the first and/or the second direction until the signal bit has been redirected to the row or the column of redundant TSVs.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
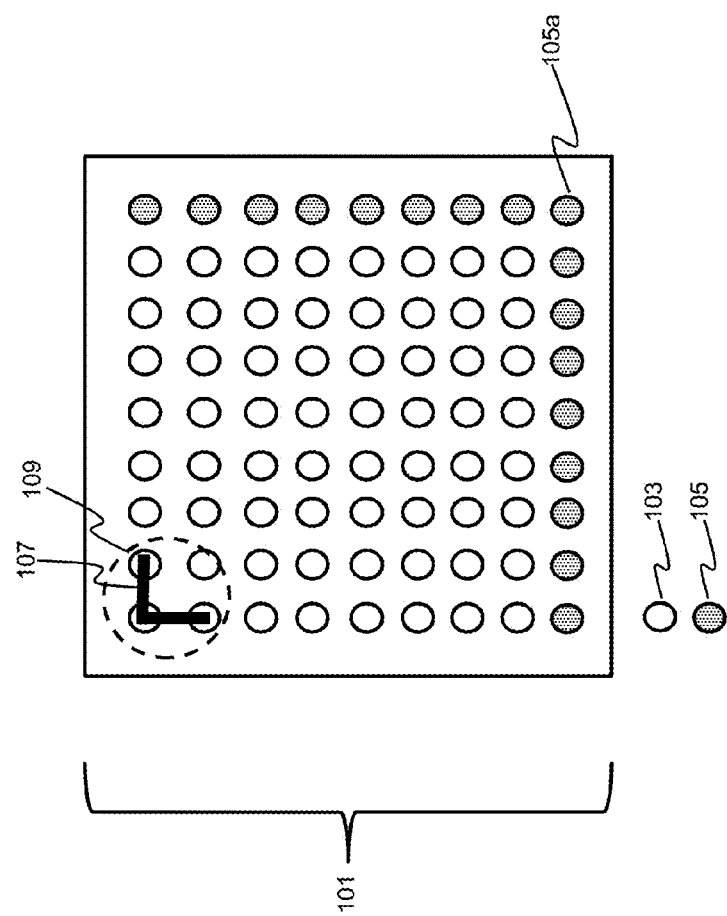
FIG. 1 schematically illustrates a TSV array including a row and a column of redundant TSVs, in accordance with an exemplary embodiment.

Adverting to FIG. 1, a TSV array 101 is formed with signal TSVs 103 and redundant TSVs 105. Each TSV is connected to a 2:4 Decoder and 4:2 Priority Encoder (both not shown for illustrative convenience). In addition, each 2:4 Decoder corresponding to a signal TSV 103 connects the signal TSV 103 with an adjacent signal TSV 103 in a first direction, e.g., to the right, and an adjacent signal TSV 103 in a second direction, e.g., down, forming an "L-shaped" pattern, which is depicted by the line 107 within the dashed circle 109. In this example, the row and column of redundant TSVs 105 are located on the bottom and right edges of the TSV array 101 and share the redundant TSV 105a. However, the row and column of redundant TSVs 105 could also be rotated to the left and bottom edges, the left and top edges, or the top and right edges of the TSV array 101.

Figure 2:
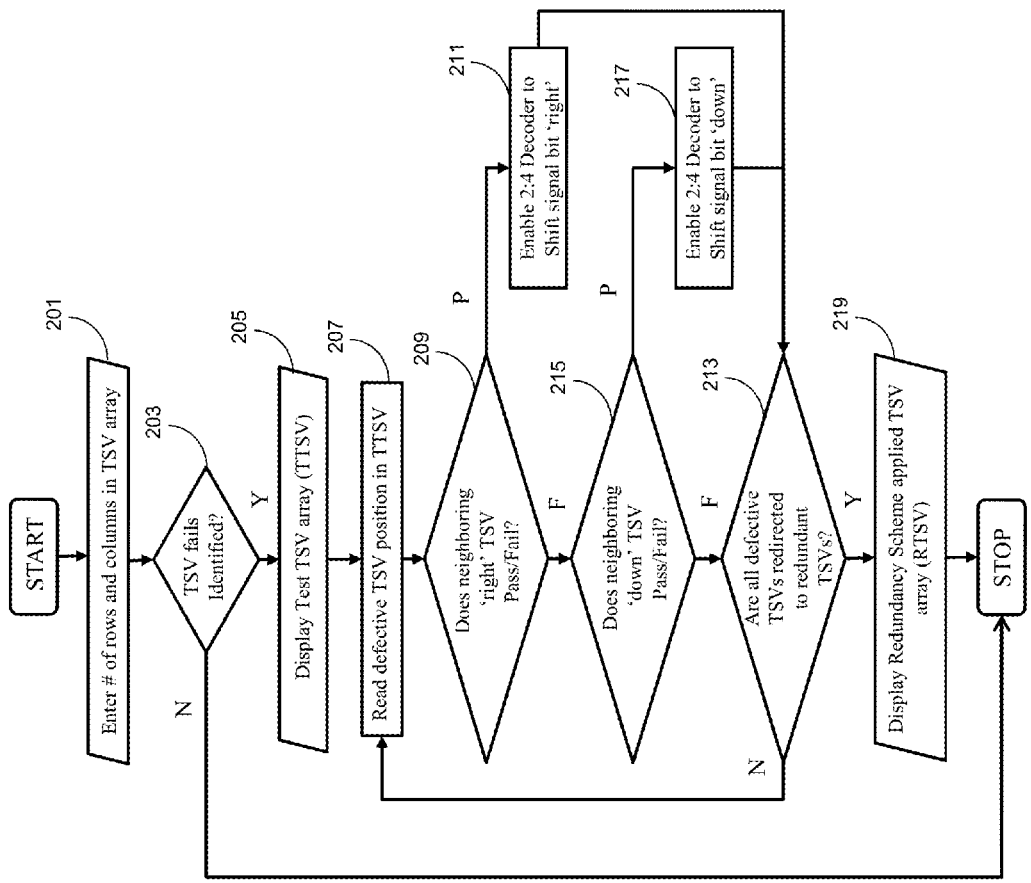
FIG. 2 illustrates a TSV redundancy scheme flow, in accordance with an exemplary embodiment.

FIG. 2 illustrates a TSV redundancy scheme flow, in accordance with an exemplary embodiment, and FIGS. 3A through 3F schematically illustrate an example test case based on the TSV redundancy scheme flow, in accordance with an exemplary embodiment. In step 201, a TSV array is defined by the number of rows and columns of TSVs. For example, the TSV array 301 of FIGS. 3A through 3F is a 4×4 TSV array. The TSV array 301 includes a row 303 and a column 305 of redundant TSVs, as depicted by the dashed lines 303 and 305, respectively. Each TSV of the TSV array 301 is attached to a 2:4 Decoder in the bottom die and a 4:2 Priority Encoder in the top die (the dies, Decoders, and Priority Encoders are all not shown for illustrative convenience). In addition, each signal TSV or non-redundant TSV, e.g., a TSV located outside of the dashed lines 303 and 305 is connected to an adjacent TSV in a first direction, e.g., to the right, and an adjacent TSV in a second direction, e.g., down, by a 2:4 Decoder, the TSVs forming a "L-shaped" pattern. Moreover, a signal bit is allocated to each signal TSV in the TSV array 301, whereas at the initial stage, there are no signal bits allocated to the redundant TSVs.

Figure 3C:
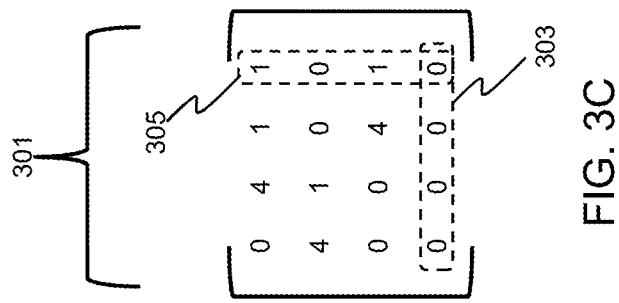
FIGS. 3A through 3F schematically illustrate an example test case based on the TSV redundancy scheme flow, in accordance with an exemplary embodiment.
Figure 3B:
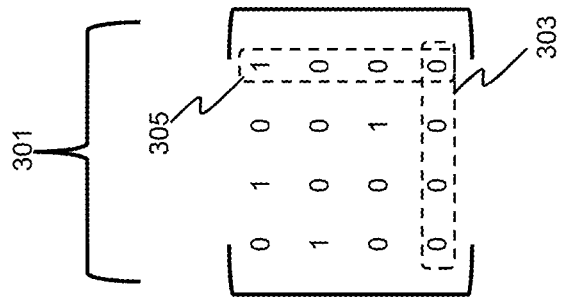
Figure 3A:
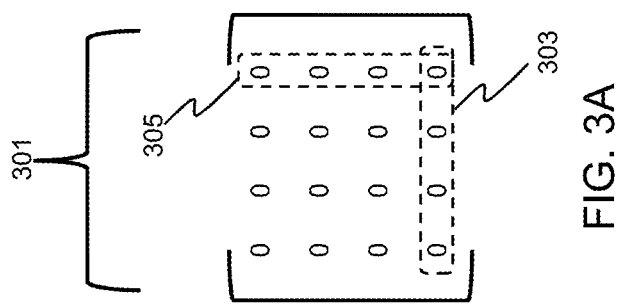

In step 203, each TSV is tested, e.g., by using one or more eFuse cells, to identify one or more defective TSVs of the TSV array, e.g., the TSV array 301. In step 205, the results of the example testing are displayed in the tested TSV array (TTSV), e.g., as depicted in FIG. 3B. In step 207, a defective TSV position in the TTSV is read. In this example, each "0" of FIG. 3B represents a good/pass TSV and each "1" represents a bad/fail TSV. Therefore, the TSVs at the intersection of Row 1 and Column 2, Row 1 and Column 4, Row 2 and Column 1, and Row 3 and Column 3 of FIG. 3B are read as being defective. If a TSV does not fail, the proposed redundancy scheme is not required.

In step 209, whether to shift a signal bit associated with or corresponding to a defective TSV in a first direction towards the row or the column of redundant TSVs is determined by ascertaining whether a neighboring or adjacent TSV in the first direction is also defective. For example, the TSV at the intersection of Row 1 and Column 2 is checked to determine if a neighboring TSV in a first direction, e.g., to the right, is defective. In this example, the neighboring TSV, e.g., the TSV at the intersection of Row 1 and Column 3, is not defective. Likewise, the TSV at the intersection of Row 1 and Column 4 is checked to determine if a neighboring TSV in a first direction, e.g., to the right, is defective. In this example, there is no neighboring TSV since the defective TSV at Row 1 and Column 4 is already a redundant TSV and, therefore, no redirection is required. The TSV at the intersection of Row 2 and Column 1 is also checked to determine if a neighboring TSV in a first direction, e.g., to the right, is defective. In this example, the neighboring TSV, e.g., the TSV at the intersection of Row 2 and Column 2, is not defective. Further, the TSV at the intersection of Row 3 and Column 3 is checked to determine if a neighboring TSV in a first direction, e.g., to the right, is defective. In this example, the neighboring TSV, e.g., the TSV at the intersection of Row 3 and Column 4, is not defective.

In step 211, the 2:4 Decoder associated with each defective TSV is used to redirect the signal bit associated with the defective TSV to the adjacent TSV in the first direction, e.g., to the right. The 2:4 Decoder may shift a signal bit in the first direction, e.g., to the right, by changing a select line of the signal bit from (00) to (01). Once the signal bit associated with a defective TSV, i.e., the originally/initially allocated signal bit, is redirected to an adjacent TSV in the first or second direction, it displaces the signal bit originally/initially allocated to that adjacent TSV causing a domino effect or chain reaction until a signal bit corresponding to or representing the defective TSV is redirected to a redundant TSV for which there is no initial allocation of a signal bit. For example, the 2:4 Decoder associated with the defective TSV at Row 1 and Column 2 is used to redirect the signal bit associated with that TSV to the adjacent TSV in the first direction, e.g., to the right (at Row 1 and Column 3). The 2:4 Decoder associated with the defective TSV at Row 2 and Column 1 is used to redirect the signal bit associated with that TSV to the adjacent TSV in the first direction, e.g., to the right (at Row 2 and Column 2). Further, the 2:4 Decoder associated with the defective TSV at Row 3 and Column 3 is used to redirect the signal bit associated with that TSV to the adjacent TSV in the first direction, e.g., to the right (at Row 3 and Column 4). Adverting to FIG. 3C, the change of the select line by the respective 2:4 Decoders in the first direction is represented in the TTSV, for example, by giving the number "4" to a TSV from which the signal bit was shifted in the first direction and by giving the number "1" to a TSV where the original/initial signal bit was displaced by the redirected signal bit.

In step 213, the TTSV is examined to determine whether the number of signal bits corresponding to the number of defective TSVs have been redirected to the row or the column of redundant TSVs, e.g., row 303 and column 305. In this example, as illustrated in FIG. 3C, only one signal bit has been redirected to the row or the column of redundant TSVs, e.g., from the TSV at Row 3 and Column 3 to the redundant TSV at Row 3 and Column 4. As a result, two more signal bits corresponding to the defective TSVs at Row 1 and Column 2 and Row 2 and Column 1 still need to be redirected to the row or the column of redundant TSVs. Consequently, step 207 is repeated.

Although it is contemplated that the shifting of a signal bit associated with or corresponding to a defective TSV may be repeated until the signal bit has been redirected to a row or a column of redundant TSVs before shifting a signal bit associated with another defective TSV or that each signal bit associated with or corresponding to each defective TSV may be shifted in the first or second direction per "round" of redirections and displacements, the availability of a TSV of the TSV array 301 for such redirections and displacements may depend on which process flow is selected. In this example, each signal bit associated with or corresponding to a defective TSV is shifted in the first or second direction per each round of redirections and displacements to provide a greater probability of available TSVs for such redirections and displacements.

In step 207, as illustrated in FIG. 3C, it is determined that the signal bit associated with the defective TSV at Row 1 and Column 2 has now been redirected to the TSV at Row 1 and Column 3 and the signal bit associated with the defective TSV at Row 2 and Column 1 has now been redirected to the TSV at Row 2 and Column 2. Repeating step 209 with respect to the TSV corresponding to the redirected signal bit at Row 1 and Column 3, the adjacent TSV in the first direction, e.g., to the right (at Row 1 and Column 4), is ascertained to also be defective. In contrast, repeating step 209 with respect to the TSV corresponding to the redirected signal bit at Row 2 and Column 2, the adjacent TSV in the first direction, e.g., to the right (at Row 2 and Column 3), is ascertained to be non-defective. However, if step 211 is repeated with respect to the original/initial signal bit allocated to the TSV at Row 2 and Column 2, the original/initial signal bit allocated to the TSV at Row 1 and Column 3 could not be displaced or redirected to the row or the column of redundant TSVs. Because the original/initial signal bit allocated to the TSV at Row 1 and Column 3 cannot be displaced in the first direction, e.g., to the right, and displacing the original/initial signal bit allocated to the TSV at Row 2 and Column 2 in the first direction, e.g., to the right, would prevent a signal bit associated with or corresponding to another defective TSV from being shifted to the row or the column of redundant TSVs, the process flow continues to step 215.

In step 215, whether to shift a signal bit associated with or corresponding to a defective TSV in a second direction towards the row or the column of redundant TSVs is determined by ascertaining whether a neighboring or adjacent TSV in the second direction is defective. For example, the TSV at the intersection of Row 1 and Column 3 is checked to determine if a neighboring TSV in a second direction, e.g., down, is defective. In this example, as illustrated in FIG. 3C, the neighboring TSV, e.g., the TSV at the intersection of Row 2 and Column 3, is not defective. Similarly, the TSV at the intersection of Row 2 and Column 2 is checked to determine if a neighboring TSV in a second direction, e.g., down, is defective. In this example, the neighboring TSV, e.g., the TSV at the intersection of Row 3 and Column 2, is also not defective.

In step 217, each 2:4 Decoder associated with a TSV of the now redirected signal bits (at Row 1 and Column 3 and at Row 2 and Column 2) is used to redirect or displace the original/initial signal bit associated with that TSV in the second direction, e.g., down. The 2:4 Decoder may shift a signal bit in the second direction, e.g., down, by changing a select line of the signal bit from (00) to (10). For example, the 2:4 Decoder associated with the TSV at Row 1 and Column 3 is used to redirect the original/initial signal bit allocated to that TSV to the adjacent TSV in the second direction, e.g., down (to the TSV at the intersection of Row 2 and Column 3). Likewise, the 2:4 Decoder associated with the TSV at Row 2 and Column 2 is used to redirect the original/initial signal bit allocated to that TSV to the adjacent TSV in the second direction, e.g., down (to the TSV at the intersection of Row 3 and Column 2). Adverting to FIG. 3D, the change of a select line by the respective 2:4 Decoders in the second direction is represented in the TTSV, for example, by giving the number "8" to a TSV from which the signal bit was shifted in the second direction and by giving the number "1" to a TSV where the original/initial signal bit was displaced by the redirected signal bit.

Figure 3D:
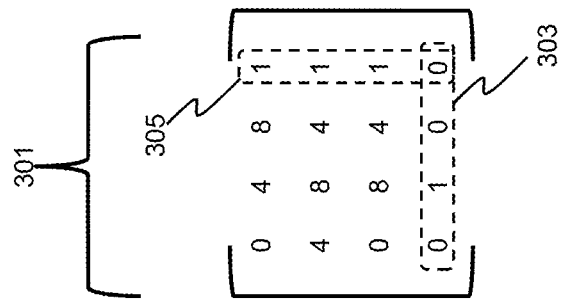

In step 213, the TTSV is again examined to determine whether the number of signal bits corresponding to the number of defective TSVs have been directed to the row or the column of redundant TSVs, e.g., row 303 and column 305. In this example, as illustrated in FIG. 3D, still only one signal bit has been redirected to the row or the column of redundant TSVs. Therefore, step 207 is repeated.

In step 207, as illustrated in FIG. 3D, it is determined that the signal bit associated with the defective TSV at Row 1 and Column 2 has now caused the original/initial signal bit associated with the TSV at Row 1 and Column 3 to be redirected to the TSV at Row 2 and Column 3 and the signal bit associated with the defective TSV at Row 2 and Column 1 has now caused the original/initial signal bit associated with the TSV at Row 2 and Column 2 to be redirected to the TSV at Row 3 and Column 2. Repeating step 209 with respect to the TSV corresponding to the redirected signal bit at Row 2 and Column 3, the adjacent TSV in the first direction, e.g., to the right (at Row 2 and Column 4), is ascertained to be non-defective and a redundant TSV. In contrast, repeating step 209 with respect to the TSV corresponding to the redirected signal bit at Row 3 and Column 2, the adjacent TSV in the first direction, e.g., to the right (at Row 3 and Column 3), is ascertained to have already been associated with a shifted and/or displaced signal bit and, therefore, is not available for further redirecting of a signal bit.

In this example, because shifting either the signal bit associated with the TSV at the intersection of Row 2 and Column 3 or the signal bit associated with the TSV at Row 3 and Column 2 will not prevent a signal bit associated with or corresponding to another defective TSV from being shifted to the row or the column of redundant TSVs, the order in which the signal bits are redirected does not matter.

In step 211, following the initial order of defective TSVs, for example, the 2:4 Decoder associated with the TSV corresponding to the redirected signal bit at Row 2 and Column 3 is used to redirect the original/initial signal bit associated with that TSV to the adjacent TSV in the first direction, e.g., to the right (to the TSV at the intersection of Row 2 and Column 4). Adverting to FIG. 3E, the change of the select line by the 2:4 Decoder in the first direction is again represented in the TTSV, for example, by giving the number "4" to a TSV from which the signal bit was shifted in the first direction and by giving the number "1" to a TSV where the original/initial signal bit was displaced by the redirected signal bit.

Figure 3E:
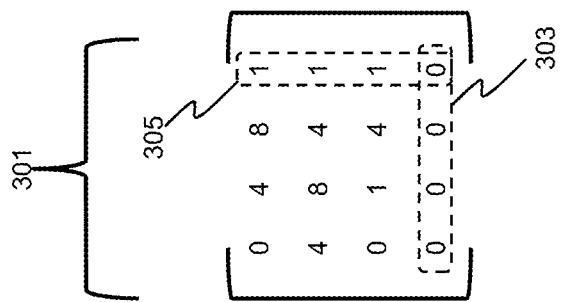

In step 213, the TTSV is reexamined to determine whether the number of signal bits corresponding to the number of defective TSVs have been redirected to the row or the column of redundant TSVs, e.g., row 303 and column 305. In this example, as illustrated in FIG. 3E, a signal bit corresponding to the defective TSV at Row 1 and Column 2 has now been redirected to the row or the column of redundant TSVs, e.g., column 305; however, a signal bit corresponding to the defective TSV at Row 2 and Column 1 still has not yet been redirected to the row or the column of redundant TSVs. Consequently, step 207 is repeated.

In step 207, it is determined that the signal bit associated with the defective TSV at Row 2 and Column 1 has now caused the original/initial signal bit associated with the TSV at Row 2 and Column 2 to be redirected to the TSV at Row 3 and Column 2. As discussed above, step 209 is not repeated again because it was already determined that the adjacent TSV in the first direction, e.g., to the right (at Row 3 and Column 3) has already been associated with a shifted signal bit and, therefore, is not available for redirecting a signal bit. Therefore, step 215 is repeated with respect to the TSV at Row 3 and Column 2.

Repeating step 215, the adjacent TSV in the second direction, e.g., down (at Row 4 and Column 2), is ascertained to be non-defective and a redundant TSV. In step 217, the 2:4 Decoder associated with the TSV at Row 3 and Column 2 is used to redirect the original/initial signal bit associated with that TSV to the adjacent TSV in the second direction, e.g., down (to the TSV at the intersection of Row 4 and Column 2). Adverting to FIG. 3F, the change of the select line by 2:4 Decoder in the second direction is again represented in the TTSV, for example, by giving the number "8" to a TSV from which the signal bit was shifted in the second direction and by giving the number "1" to a TSV where the original/initial signal bit was displaced by the redirected signal bit.

Figure 3F:
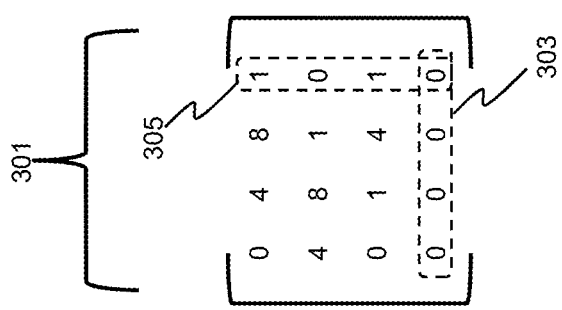

In step 213, the TTSV is again examined to determine whether the number of signal bits corresponding to the number of defective TSVs have all been redirected to the row or the column of redundant TSVs, e.g., row 303 and column 305. In this example, as illustrated in FIG. 3F, three signal bits corresponding to the three defective signal TSVs have now been redirected to the row or the column of redundant TSVs. Consequently, in step 219, the redundancy scheme applied to the TSV array 301 is displayed, as depicted in FIG. 3F.

Figure 4:
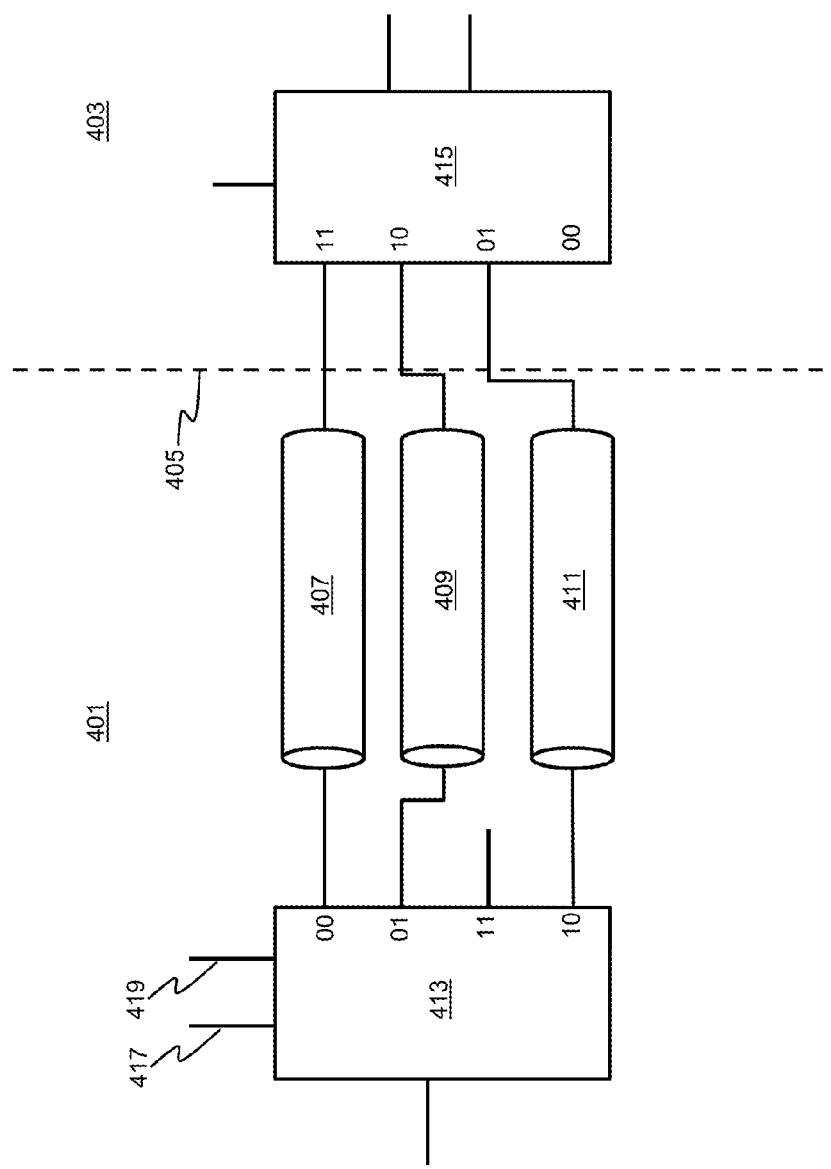
FIG. 4 schematically illustrates an example of a 2:4 Decoder connected with three adjacent TSVs and a 4:2 Priority Encoder, in accordance with an exemplary embodiment.

FIG. 4 schematically illustrates an example of a 2:4 Decoder connected with three adjacent TSVs and a 4:2 Priority Encoder, in accordance with an exemplary embodiment. As stated above, the TSV array (not shown for illustrative convenience) is formed between the bottom die 401 and the top die 403 represented by the dashed line 405 by connecting each TSV, e.g., TSVs 407, 409, and 411, to a 2:4 Decoder 413 in the bottom die 401 and a 4:2 Priority Encoder 415 in the top die 403. In this example, the TSV 407 represents the signal TSV at the intersection of Row 1 and Column 1 of FIG. 3B, the TSV 409 represents the signal TSV at Row 1 and Column 2 of FIG. 3B, and the TSV 411 represents the signal TSV at Row 2 and Column 1 of FIG. 3B.

Similar to step 203 of FIG. 2, each of the TSVs of the TSV array, e.g., the TSVs 407, 409, and 411, are tested, e.g., using one or more eFuse cells, to identify one or more defective TSVs of the TSV array. In this example and as depicted in FIG. 3B, the TSVs 409 and 411 are identified as being defective. Consequently, when an input signal bit is received by the 2:4 Decoder 413 corresponding to the TSV 407, the signal bit may either flow through the TSV 407 to the 4:2 Priority Encoder 415 as (00), i.e., a default signal, or the 2:4 Decoder 413 may change the select line of the signal bit from (00) to (11) by programming the select signals 417 and 419.

In contrast, when an input signal bit is received by the 2:4 Decoder 413 corresponding to the TSVs 409 and 411, the signal bit needs to be redirected to an adjacent non-defective TSV and/or to the row or the column of redundant TSVs of the TSV array. As described above, the 2:4 Decoder 413 may redirect the signal bit by changing the select line of the signal bit from (00) to (01) to shift the signal bit in a first direction, e.g., to the right, or from (00) to (10) to shift the signal bit in a second direction, e.g., down. Again, once the number of signal bits corresponding to the number of defective signal TSVs have been redirected to the row or the column of redundant TSVs, the redundancy scheme applied to the TSV array is displayed, as depicted in FIG. 3F.

Figure 5:
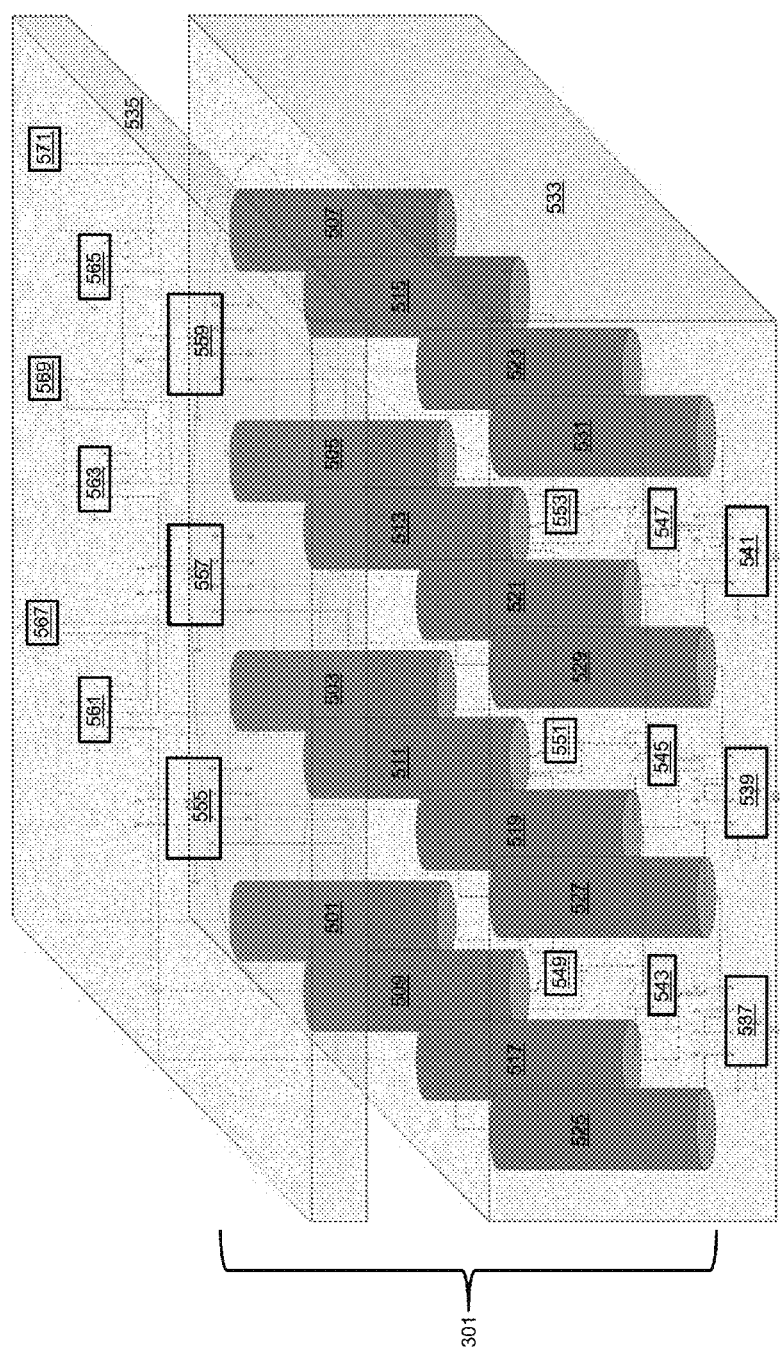
FIG. 5 schematically illustrates the TSV redundancy scheme architecture applied to a 4×4 TSV array, in accordance with an exemplary embodiment.

FIG. 5 schematically illustrates the TSV redundancy scheme architecture applied to a 4×4 TSV array, in accordance with an exemplary embodiment. FIG. 5 is an axiomatic depiction of the TSV array 301 of FIG. 3A including TSVs 501, 503, 505, 507, 509, 511, 513, 515, 517, 519, 521, 523, 525, 527, 529, and 531, which are formed between a bottom die 533 and a top die 535 of a 3D IC stack. The TSV array 301 includes a row of redundant TSVs, e.g., TSVs 501, 503, 505, and 507 (column 305 of FIG. 3A), and a column of redundant TSVs, e.g., TSVs 507, 515, 523, and 531 (row 303 of FIG. 3A), wherein the TSV 507 is shared by both the row and the column of redundant TSVs. In addition, each TSV is connected to a 2:4 Decoder in the bottom die 533, e.g., 2:4 Decoders 537, 539, 541, 543, 545, 547, 549, 551, and 553 and a 4:2 Priority Encoder in the top die 535, e.g., 4:2 Priority Encoders 555, 557, 559, 561, 563, 565, 567, 569, and 571. Further, each non-redundant TSV, e.g., TSV 517 (at Row 1 and Column 2 of FIG. 3B) is connected to an adjacent TSV in a first direction, e.g., to the right (TSV 519) and an adjacent TSV in a second direction, e.g., up/forward (TSV 509), using a 2:4 Decoder, e.g., 2:4 Decoder 543; the TSVs 517, 519, and 509 forming a "L-shaped" pattern. As a result and following the process described with respect to steps 207-217 of FIG. 2, a 2:4 Decoder, e.g., 2:4 Decoder 543, can redirect a signal bit associated with or corresponding to a defective TSV, e.g., TSV 517, to an adjacent non-defective TSV in the first or second direction and/or to the row or the column of redundant TSVs.

The embodiments of the present disclosure can achieve several technical effects including standardization of the TSV redundancy scheme to any TSV array size and implementation in any technology node. Further, the bidirectional TSV redundancy scheme is robust and can redirect multiple fails in a single row or column of a TSV array, the architecture uses standard cell designs and avoids implementing multiplexers (MUX) and scan chains with flip-flops to reduce the test area overhead, and the architecture is easy to implement in TSV technology qualification, and does not need any extra mask layer. Embodiments of the present disclosure enjoy utility in various industrial applications as, for example, microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in 3D IC stacks.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a through silicon via (TSV) array between a bottom die and a top die of a three-dimensional (3D) integrated circuit (IC) stack, the TSV array having a row and a column of redundant TSVs, wherein each TSV in the TSV array is connected to a 2:4 Decoder in the bottom die and a 4:2 Priority Encoder in the top die;
   identifying a defective TSV of the TSV array;
   determining whether to shift a signal bit associated with or corresponding to the defective TSV in a first and/or a second direction towards the row or the column of redundant TSVs; and
   shifting the signal bit in the first and/or the second direction until the signal bit has been redirected to the row or the column of redundant TSVs.

2. The method according to claim 1, comprising connecting each 2:4 Decoder corresponding a non-redundant TSV to a first adjacent TSV in the first direction and a second adjacent TSV in the second direction, the non-redundant TSV and the first and second adjacent TSVs forming an "L-shaped" pattern.

3. The method according to claim 1, comprising identifying the defective TSV by:
  testing each TSV of the TSV array using one or more electronic fuse (eFuse) cells.

4. The method according to claim 1, determining to shift the signal bit associated with or corresponding to the defective TSV in the first direction by:
  ascertaining whether an adjacent TSV in the first direction is defective;
  shifting the signal bit in the first direction when the adjacent TSV in the first direction is non-defective;
  determining whether the signal bit has been redirected to the row or the column of redundant TSVs; and
  repeating the ascertaining, shifting, and determining steps until the signal bit has been shifted to the row or the column of redundant TSVs.

5. The method according to claim 1, comprising shifting the signal bit in the first direction by:
  enabling the 2:4 Decoder to change a select line of the signal bit from (00) to (01).

6. The method according to claim 1, determining to shift the signal bit associated with or corresponding to the defective TSV in the second direction by:
  determining that an adjacent TSV in the first direction is defective;
  ascertaining whether an adjacent TSV in the second direction is defective;
  shifting the signal bit in the second direction when the adjacent TSV in the second direction is non-defective;
  determining whether the signal bit has been redirected to the row or the column of redundant TSVs; and
  repeating the ascertaining, shifting, and determining steps until the signal bit has been shifted to the row or the column of redundant TSVs.

7. The method according to claim 1, comprising shifting the signal bit in the second direction by:
  enabling the 2:4 Decoder to change a select line of the signal bit from (00) to (10).

8. The method according to claim 1, further comprising enabling the 2:4 Decoder to change a select line of a signal bit associated with a non-defective TSV from (00) to (11).

9. A device comprising:
  a bottom die of a three-dimensional (3D) integrated circuit (IC) stack;
  a top die of the 3D IC stack;
  a plurality of 2:4 Decoders formed in the bottom die;
  a plurality of 4:2 Priority Encoders formed in the top die; and
  a TSV array connected by the plurality of 2:4 Decoders and the 4:2 Priority Encoders, the TSV array formed with a row and a column of redundant TSVs.

10. The device according to claim 9, wherein a redundant TSV is shared by the row and the column of redundant TSVs.

11. The device according to claim 9, wherein each TSV of the TSV array is attached to a 2:4 Decoder in the bottom die and a 4:2 Priority Encoder in the top die.

12. The device according to claim 9, wherein each non-redundant TSV is connected to a first adjacent TSV in a first direction and a second adjacent TSV in a second direction using a 2:4 Decoder, the non-redundant TSV and the first and second adjacent TSVs being connected in an "L-shaped" pattern.

13. The device according to claim 12, wherein a signal bit associated with or corresponding to a defective TSV is redirected by a 2:4 Decoder to an adjacent non-defective TSV in the first or the second direction and/or to the row or the column of redundant TSVs.

14. A method comprising:
  forming a through silicon via (TSV) array between a bottom die and a top die of a three-dimensional (3D) integrated circuit (IC) stack, the TSV array having a row and a column of redundant TSVs;
  connecting each TSV to a 2:4 Decoder in the bottom die and a 4:2 Priority Encoder in the top die;
  testing each TSV of the TSV array using one or more electronic fuse (eFuse) cells;
  identifying a defective TSV of the TSV array based on the testing;
  determining whether to shift a signal bit associated with or corresponding to the defective TSV in a first and/or a second direction towards the row or the column of redundant TSVs; and
  shifting the signal bit in the first and/or the second direction until the signal bit has been redirected to the row or the column of redundant TSVs.

15. The method according to claim 14, comprising connecting each 2:4 Decoder corresponding a non-redundant TSV to a first adjacent TSV in the first direction and a second adjacent TSV in the second direction, the non-redundant TSV and the first and second adjacent TSVs forming an "L-shaped" pattern.

16. The method according to claim 14, determining to shift the signal bit associated with or corresponding to the defective TSV in the first direction by:
  ascertaining whether an adjacent TSV in the first direction is (a) defective; (b) was already associated with a shifted signal bit; or (c) could prevent a signal bit associated with or corresponding to another defective TSV from being shifted to the row or the column of redundant TSVs;
  shifting the signal bit in the first direction when the adjacent TSV in the first direction is (a) non-defective; (b) not already associated with a shifted signal bit; and (c) could not prevent a signal bit associated with or corresponding to another defective TSV from being shifted to the row or the column of redundant TSVs;
  determining whether the signal bit has been redirected to the row or the column of redundant TSVs; and
  repeating the ascertaining, shifting, and determining steps until the signal bit has been shifted to the row or the column of redundant TSVs.

17. The method according to claim 14, comprising shifting the signal bit associated with or corresponding to the defective TSV in the first direction by:
  enabling a 2:4 Decoder to change a select line of the signal bit from (00) to (01).

18. The method according to claim 14, determining to shift the signal bit associated with or corresponding to the defective TSV in the second direction by:
  determining that an adjacent TSV in the first direction is defective;
  ascertaining whether an adjacent TSV in the second direction is (a) defective; (b) was already associated with a shifted signal bit; or (c) could prevent a signal bit associated with or corresponding to another defective TSV from being shifted to the row or the column of redundant TSVs;
  shifting the signal bit in the second direction when the adjacent TSV in the second direction is (a) non-defective; (b) not already associated with a shifted signal bit; and (c) could not prevent a signal bit associated with or corresponding to another defective TSV from being shifted to the row or the column of redundant TSVs;

determining whether the signal bit has been redirected to the row or the column of redundant TSVs; and repeating the ascertaining, shifting, and determining steps until the signal bit has been shifted to the row or the column of redundant TSVs.

19. The method according to claim 14, comprising shifting the signal bit associated with or corresponding to the defective TSV in the second direction by:

enabling a 2:4 Decoder to change a select line of the signal bit from (00) to (10).

* * * * *